United States Patent
Buckley

(10) Patent No.: US 7,590,395 B2
(45) Date of Patent: Sep. 15, 2009

(54) POWER MANAGEMENT SCHEME FOR SOFTWARE-DEFINED RADIOS

(75) Inventor: Richard James Buckley, Henrietta, NY (US)

(73) Assignee: Harris Corporation, Melbourne, FL (US)

( * ) Notice: Subject to any disclaimer, the term of this patent is extended or adjusted under 35 U.S.C. 154(b) by 447 days.

(21) Appl. No.: 11/494,287

(22) Filed: Jul. 27, 2006

(65) Prior Publication Data

US 2008/0026710 A1 Jan. 31, 2008

(51) Int. Cl.
*H04B 1/04* (2006.01)
*H01Q 11/12* (2006.01)

(52) U.S. Cl. .............. 455/127.1; 455/126; 455/127.2; 330/285; 330/296

(58) Field of Classification Search ........... 455/126, 455/127.1–127.4, 552.1, 553.1; 330/259, 330/278, 285, 291, 296, 302, 86, 130
See application file for complete search history.

(56) References Cited

U.S. PATENT DOCUMENTS

| | | | |
|---|---|---|---|
| 4,547,746 A | 10/1985 | Erickson et al. | |
| 5,081,425 A | 1/1992 | Jackson et al. | |
| 5,126,688 A * | 6/1992 | Nakanishi et al. | 330/285 |
| 6,169,449 B1 * | 1/2001 | Hasegawa | 330/51 |
| 6,362,690 B1 | 3/2002 | Tichauer | |
| 6,438,360 B1 * | 8/2002 | Alberth et al. | 455/110 |
| 6,636,747 B2 * | 10/2003 | Harada et al. | 455/552.1 |
| 6,639,471 B2 * | 10/2003 | Matsuura et al. | 330/302 |
| 7,109,897 B1 * | 9/2006 | Levesque | 341/67 |
| 2003/0155978 A1 * | 8/2003 | Pehlke | 330/296 |
| 2005/0227646 A1 * | 10/2005 | Yamazaki et al. | 455/127.3 |
| 2005/0242879 A1 * | 11/2005 | Muller | 330/259 |

FOREIGN PATENT DOCUMENTS

WO   WO 98/47222 A   10/1998

* cited by examiner

*Primary Examiner*—Duc M Nguyen
(74) *Attorney, Agent, or Firm*—Harness, Dickey & Pierce, P.L.C.

(57) ABSTRACT

A power management system is provided for a software-defined radio. The power management system includes: an antenna; a regulated power supply; a power amplifier; and a digital signal processor. A software-implemented power supply calculator and power supply adjustor are operable within the digital signal processor. The power supply calculator receives an indicator of a type of waveform to be transmitted by the radio and determines the drain voltage for the power amplifier based on the waveform indicator. The power supply adjustor receives forward power and reflected power values from the antenna and computes a voltage standing wave ratio (VSWR). The power supply adjustor further computes an adjustment for the drain voltage based on the VSWR.

17 Claims, 7 Drawing Sheets

POWER MANAGEMENT SCHEME FOR SOFTWARE-DEFINED RADIOS

FIELD

The present disclosure relates to software-defined radios and, more particularly, to a method and system for managing power consumption in software-defined radios.

BACKGROUND

A software-defined radio is a radio communication system whose channel waveforms are defined in software. That is, waveforms are generated as sampled digital signals, converted from digital to analog via a wideband Digital to Analog Converter (DAC) and then possibly upconverted from IF to RF. Likewise, the receiver employs a wideband Analog to Digital Converter (ADC) that captures all of the channels of the software radio node. The receiver then extracts, downconverts and demodulates the channel waveform using software on a general purpose processor. Thus, a variety of different waveforms and communication protocols can be supported in software. However, as operational complexity increases, the power demand also increases. This is of particular concern in battery-powered radios.

To transmit over a wide range of frequencies, the amplifier powering the antenna needs to handle a variety of antenna load impedances. The amplifier is typically designed to accommodate all of the anticipated load impedances. In other words, the amplifier is designed to meet the worst case scenario, thereby resulting in sub-optimum efficiency when the load impedance is good. Therefore, it is desirable to adjust the operating parameters of the amplifier to match the load impedances, thereby improving amplifier efficiency and reducing power consumption.

The statements in this section merely provide background information related to the present disclosure and may not constitute prior art.

SUMMARY

A power management system is provided for a software-defined radio. The power management system includes: an antenna; a regulated power supply; a power amplifier; and a digital signal processor. A software-implemented power supply calculator and power supply adjustor are operable within the digital signal processor. The power supply calculator receives an indicator of a type of waveform to be transmitted by the radio and determines the drain voltage for the power amplifier based on the waveform indicator. The power supply adjustor receives forward power and reflected power values from the antenna and computes a voltage standing wave ratio (VSWR). The power supply adjustor further computes an adjustment for the drain voltage based on the VSWR.

Further areas of applicability will become apparent from the description provided herein. It should be understood that the description and specific examples are intended for purposes of illustration only and are not intended to limit the scope of the present disclosure.

DRAWINGS

FIGS. 3A and 3B depict exemplary tables of drain voltages and power supply control voltages, respectively, which may be used as initial power settings for a radio amplifier;

FIG. 4 depicts an exemplary table of bias currents which may be used as initial power setting for a radio amplifier.

The drawings described herein are for illustration purposes only and are not intended to limit the scope of the present disclosure in any way.

DETAILED DESCRIPTION

Figure 1:
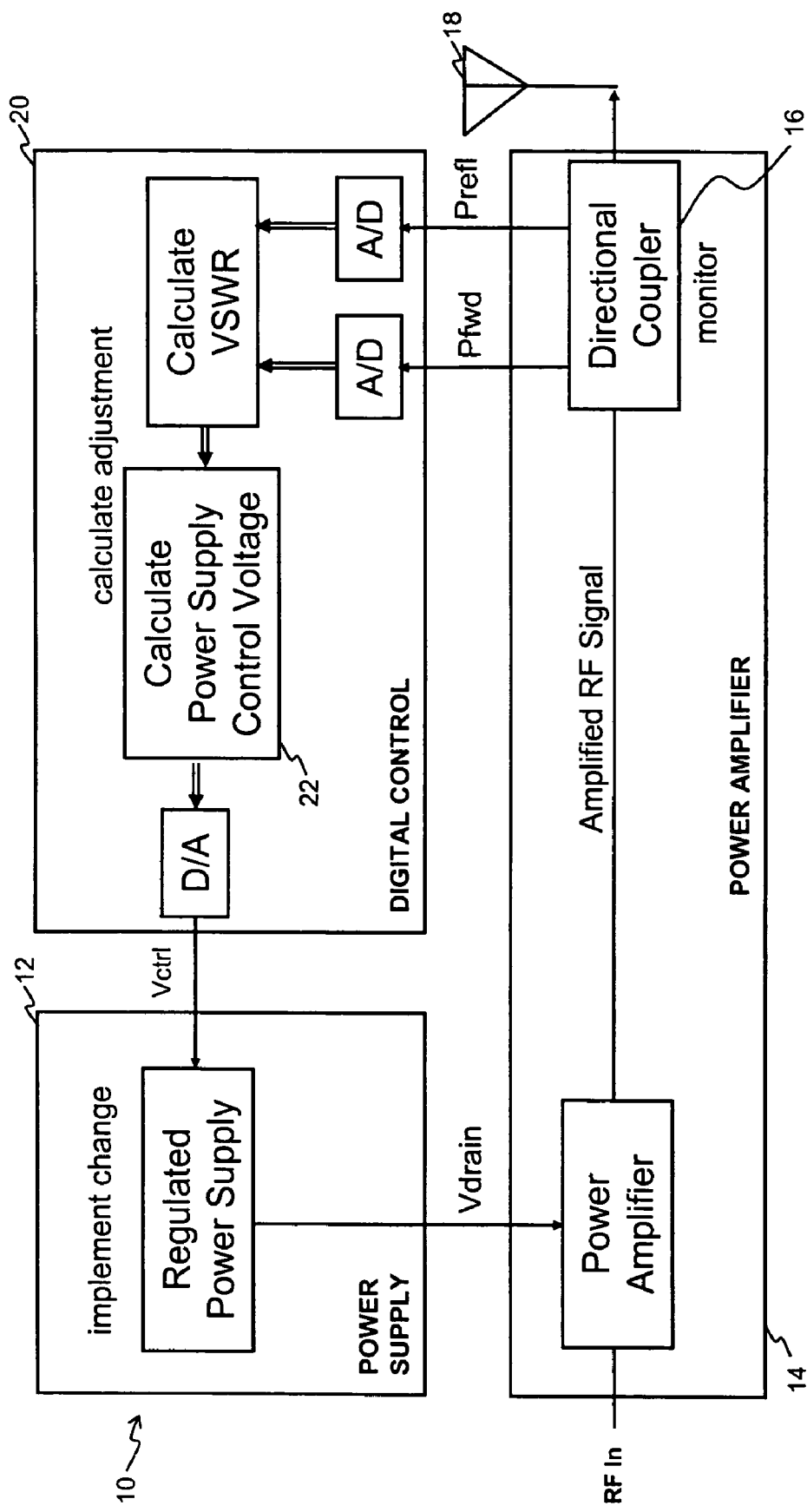
FIG. 1 is a block diagram of an exemplary transmit subsystem for a software-defined radio.

FIG. 1 depicts an exemplary transmit subsystem 10 for a software-defined radio. The transmit subsystem 10 is generally comprised of a regulated power supply 12, a power amplifier 14 operably coupled via a directional coupler 16 to an antenna 18, and a digital signal processor 20. While the following description is provided with reference to a software-defined radio, the broader aspects of this disclosure are applicable to other types of radio implementations.

The power amplifier 14 receives an RF transmit signal and amplifies the transmit signal in accordance with an input signal from the power supply 12. The amplified RF signal passes through the directional coupler 16 prior to being output to the antenna 18. The directional coupler 16 is operable to detect an amount of signal power output to the antenna 18 (referred to herein as forward power) and to detect an amount of signal power reflected by the antenna 18 (referred to herein as reflected power). Forward power and reflected power values are in turn input to the digital signal processor for subsequent processing.

Figure 2A:
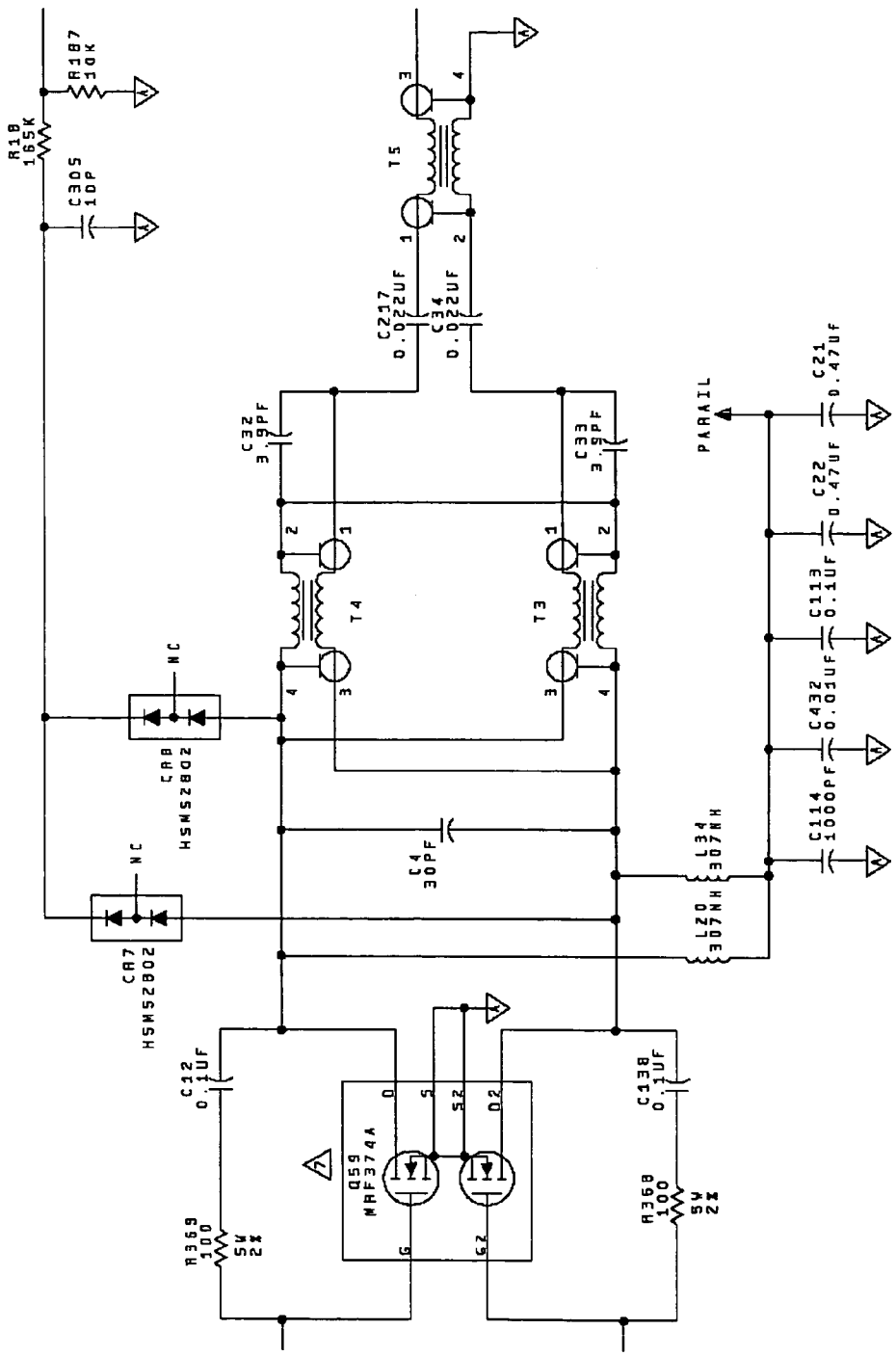
FIGS. 2A and 2B are schematics of an exemplary amplifier design and an exemplary power supply design, respectively, which may be used in the transmit subsystem of a radio.
Figure 2B:
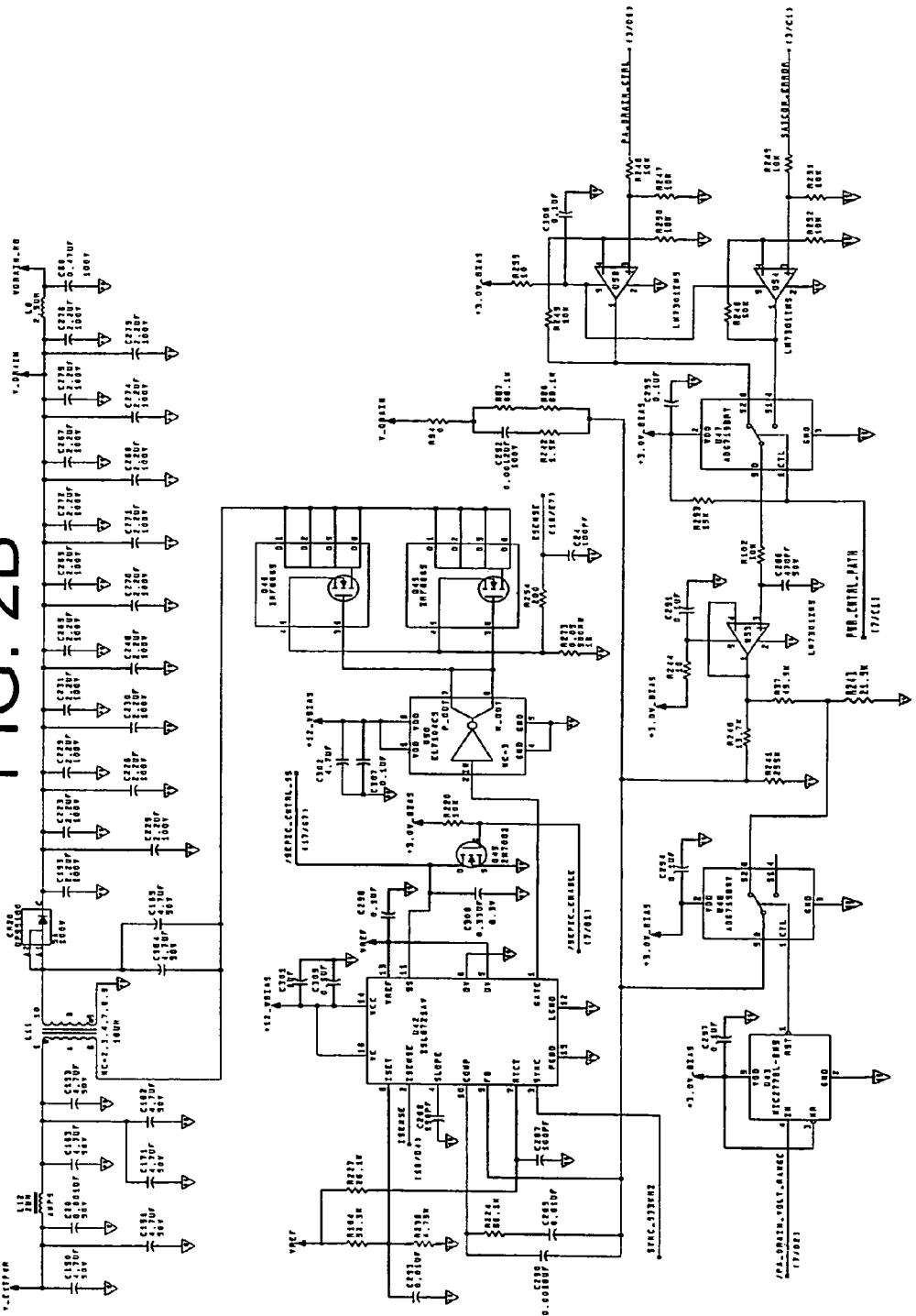

The signal amplification properties correlate to the drain voltage applied to the power amplifier 14. The power supply 12 outputs the drain voltage to the power amplifier 14. The drain voltage output by the power supply 12 is in turn regulated by a control signal from the digital signal processor 20. By controlling the control voltage supplied to the power supply 12, the digital signal processor 20 can control the drain voltage applied to the power amplifier 14 and thus control the amplification of the RF transmit signal. FIGS. 2A and 2B illustrate an exemplary amplifier design and an exemplary power supply design, respectively, which may be used in the transmit subsystem of a radio. It is readily understood that other designs are contemplated by this disclosure.

To regulate power consumption during signal transmission, the digital signal processor 20 employs two software modules: a power supply calculator 22 and a power supply adjustor 24. The power supply calculator 22 computes an initial power setting for the power amplifier 14. This initial power setting may be a function of various parameters including but not limited to the type of waveform to be transmitted, the transmission frequency for the waveform, an operational characteristic of the amplifier and combinations thereof. These various parameters are input to the power supply calculator 22 from other software components of the radio. The power supply control voltage and/or the drain voltage are then computed by the power supply calculator 22.

Figure 3A:
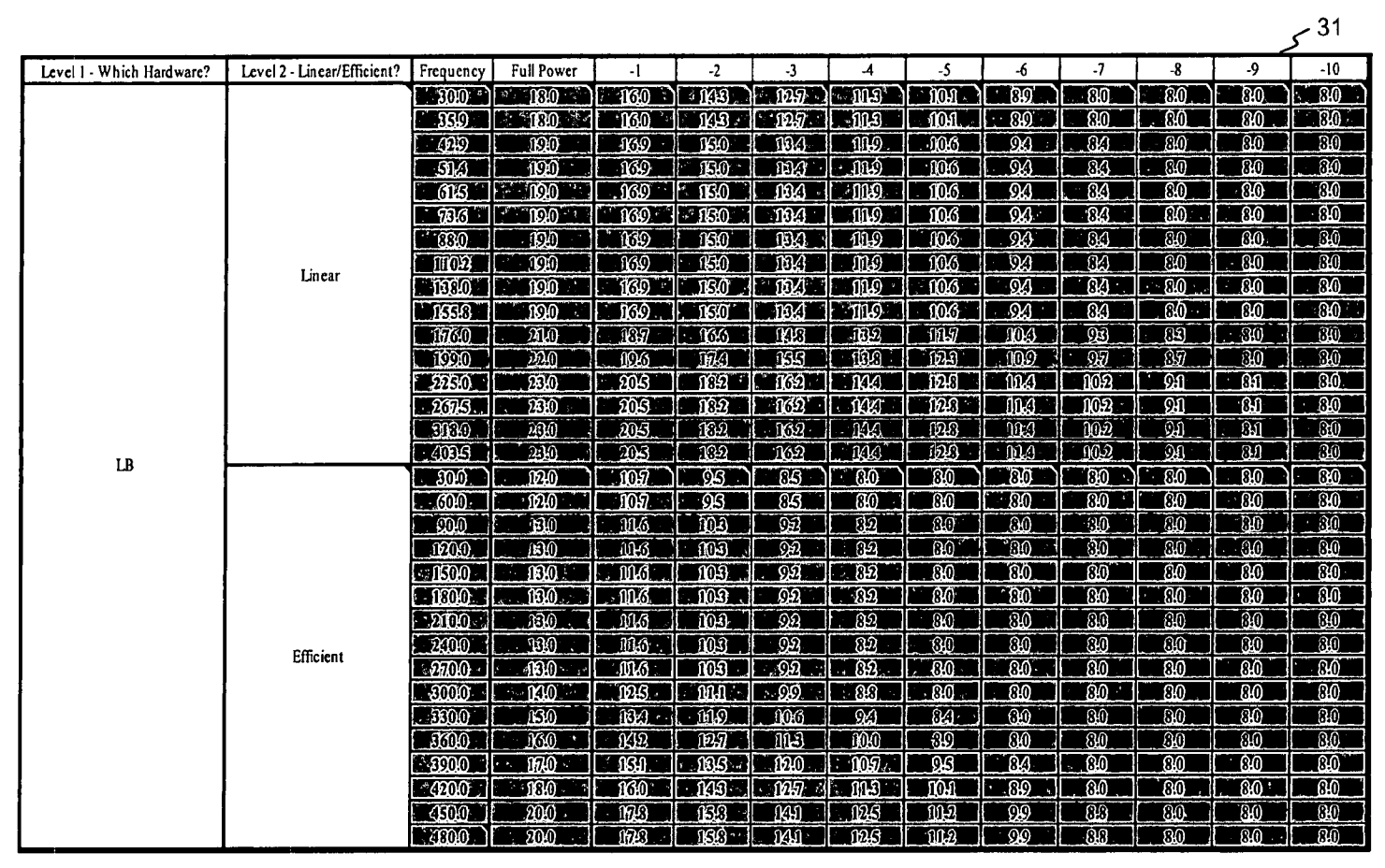

In an exemplary embodiment, the drain voltage is determined from an empirically derived table 31 as shown in FIG. 3A. Given the type of waveform and the transmission frequency for the waveform, a suitable drain voltage is read from the table during waveform instantiation. In this example, the power amplifier 14 may operate in either a linear mode or an efficient mode, where mode selection is dependant upon the waveform being transmitted as in known in the art. For instance, the amplifier is operated in a linear mode for high peak-to-average ratio waveform as opposed to being operated in an efficient mode for constant envelope waveforms. An amplifier operating in a linear mode tends to have a higher drain voltage than an amplifier operating in the efficient mode. Likewise, a waveform having a high transmission frequency tends to have a higher drain voltage than a waveform having a lower transmission frequency. A secondary conversion function or table may be referenced to convert the drain voltage to a corresponding control voltage for the adjustable power supply 14.

Figure 3B:
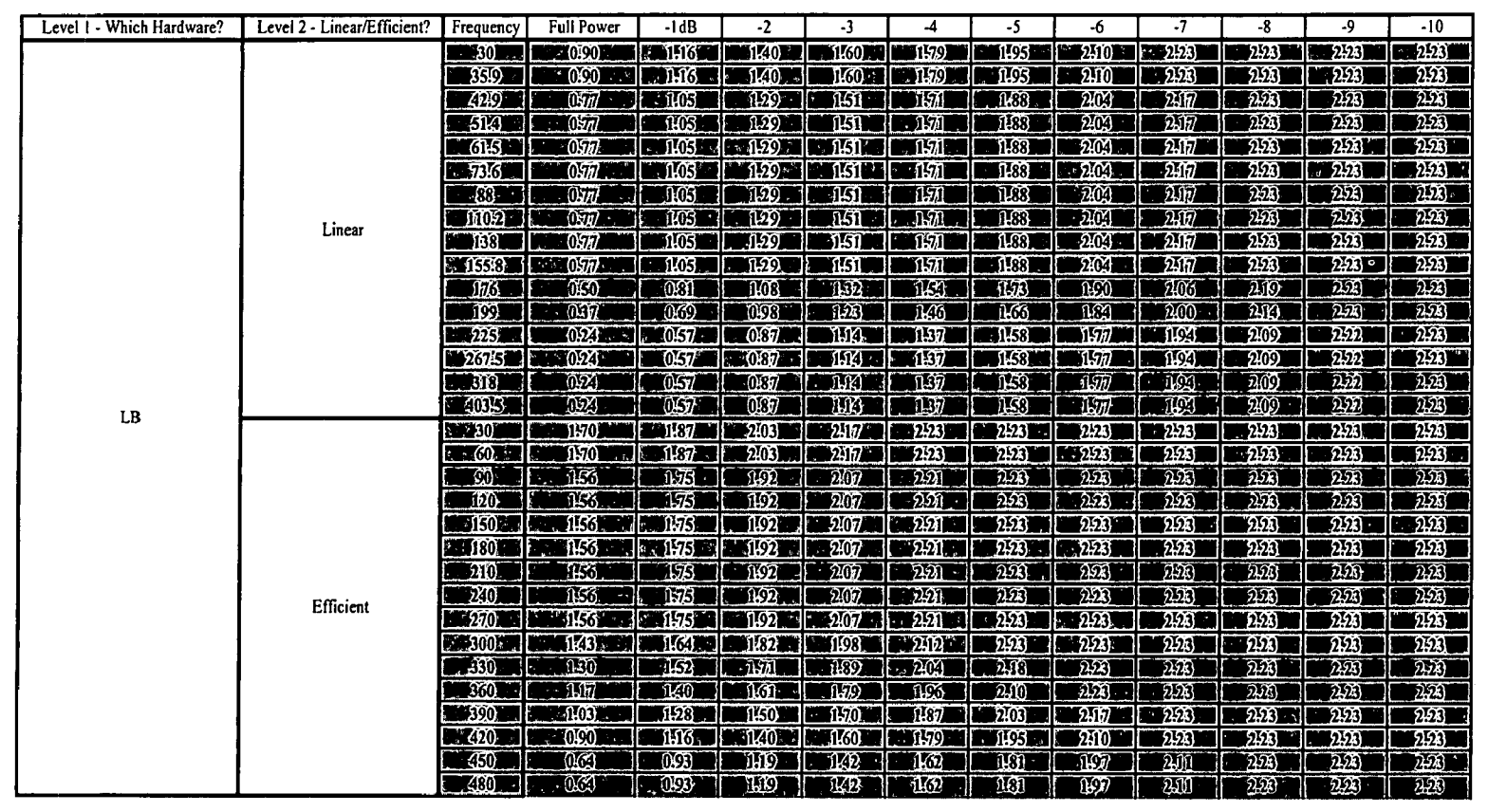

Alternatively, the power supply calculator 22 may use the input parameters to reference an empirically derived table of control voltages as shown in FIG. 3B. In either case, the RF signal is transmitted with the power amplifier set at this initial power setting. It is also envisioned that the initial power setting may be computed using one or more empirically derived equations. Thus, a first level of efficiency is achieved by tailoring the power setting to the characteristics of the transmit signal.

The power supply adjustor 24 subsequently adjusts the power setting based on a measured power efficiency at the antenna. The power supply adjustor 24 is adapted to receive forward power and reflected power values from the directional coupler 16. Based on these power values, the power supply adjustor 24 is able to compute a voltage standing wave ratio (VSWR) and adjust power output by the power amplifier 14 to the antenna 18 as a function of the VSWR. In this way, operating efficiency of the power amplifier is improved, thereby further reducing the power consumption of the radio.

More specifically, the power supply adjustor 24 may adjust the drain voltage being applied to the power amplifier 14. To do so, the power supply adjustor 24 computes a multiplier for the initial power setting. In an exemplary embodiment, the drain voltage is reduced as a function of the VSWR according to: square root of ((calculated VSWR)/(the highest anticipated value of VSWR)). Assuming the highest anticipated VSWR is three, example calculations using this equation are shown as follows:

| VSWR | Voltage Ratio | Possible Drain Voltage Reduction |
|---|---|---|
| 3.0 | 1.00 | 0% |
| 2.5 | 0.91 | 9% |
| 2.0 | 0.82 | 18% |
| 1.8 | 0.76 | 24% |
| 1.5 | 0.71 | 29% |
| 1.4 | 0.67 | 33% |
| 1.2 | 0.63 | 37% |
| 1.1 | 0.61 | 39% |
| 1.0 | 0.58 | 42% |

It is envisioned that other adjustment functions may be derived for computing the drain voltage multiplier. The power supply calculator 22 receives the multiplier from the power supply adjustor 24 and adjusts the power setting accordingly. For a measured VSWR of one, the drain voltage is reduced by about sixty percent, thereby improving the operating efficiency of the amplifier and reducing power consumption.

For a more robust implementation, the power supply adjustor 24 may employ different functions for different types of waveforms. Upon computing the VSWR, the power supply adjustor 24 selects one of two or more adjustment functions based on the waveform being transmitted. For instance, a first adjustment function is used to adjust the drain voltage for a first type of waveform; whereas, a second different adjustment function is used to adjust the drain voltage for a second type of waveform. In this way, an adjustment functions may be specifically tailored to the characteristics of the waveform.

In a complementary scheme, the signal power output by power amplifier 14 may also be controlled through the bias current for the power amplifier 14. The bias current is supplied to the power amplifier 14 by the power supply 12. The bias current output by the power supply 12 may be regulated by a control signal from the digital signal processor 20.

Figure 4:
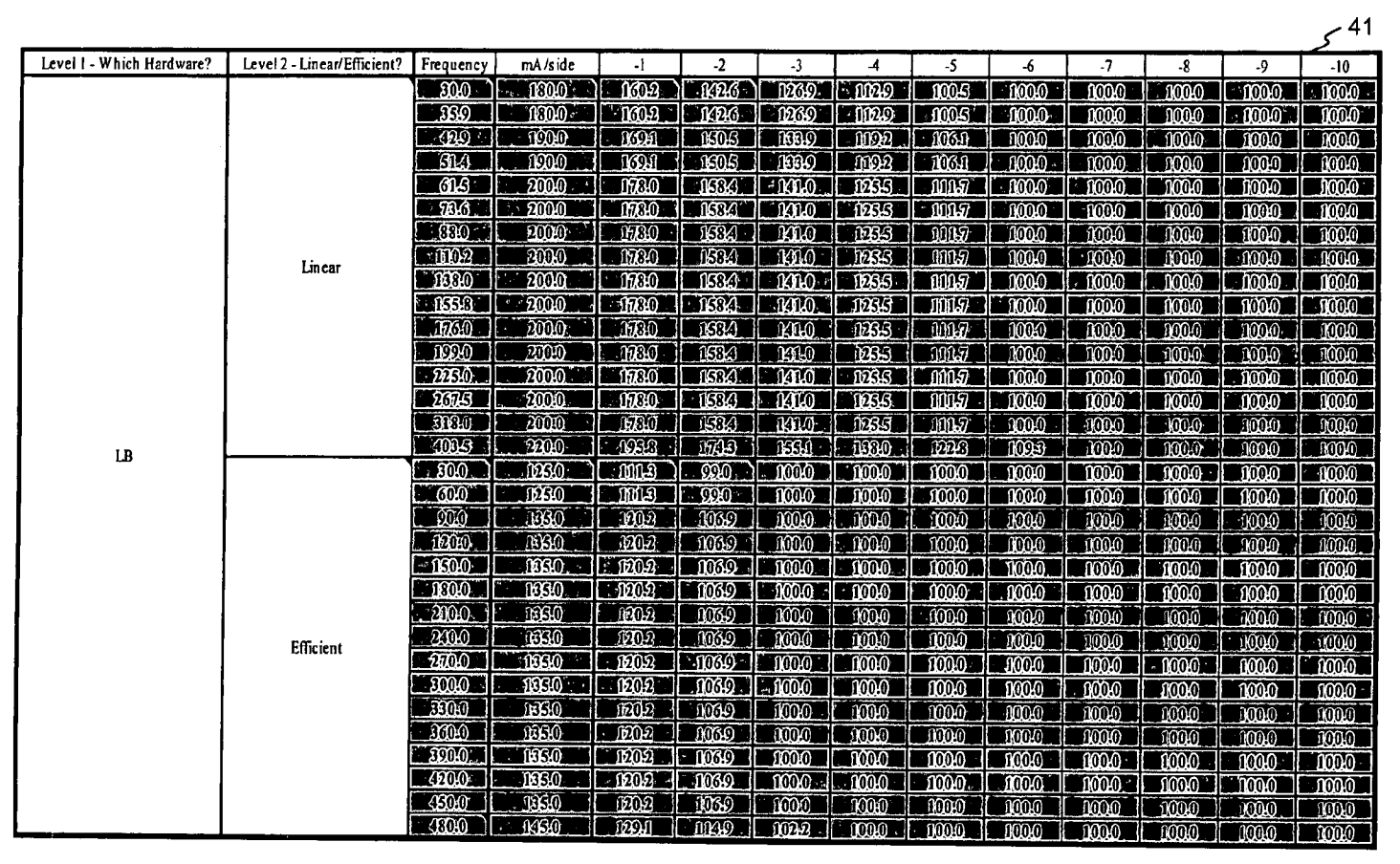

The power supply calculator 22 can also determine an initial bias current setting for the amplifier 14 in a similar manner as described above. For example, the bias current may be determined from an empirically derived table 40 as shown in FIG. 4. Given the type of waveform and the transmission frequency for the waveform, a suitable bias current is read from the table during waveform instantiation. The RF signal is transmitted with the power amplifier set at this initial bias current.

The power supply adjustor 24 may subsequently adjust the bias current based on a measured power efficiency at the antenna. To do so, the power supply adjustor 24 determines a multiplier for the initial bias current setting. Again, the bias current is adjusted as a function of VSWR. In an exemplary embodiment, multipliers for different VSWR are empirically derived for each amplifier and then stored in a table as shown below:

| VSWR | Multiply Bias Current By |
|---|---|
| 3.0 | 1.00 |
| 2.5 | 0.96 |
| 2.0 | 0.90 |
| 1.8 | 0.87 |
| 1.5 | 0.84 |
| 1.4 | 0.82 |
| 1.2 | 0.80 |
| 1.1 | 0.78 |
| 1.0 | 0.76 |

The power supply calculator 22 in turn receives the multiplier from the power supply adjustor 24 and adjusts the power setting accordingly. Although power output by the amplifier may be controlled by either the drain voltage or the bias current, it is preferably controlled through adjustments to both parameters.

Figure 5:
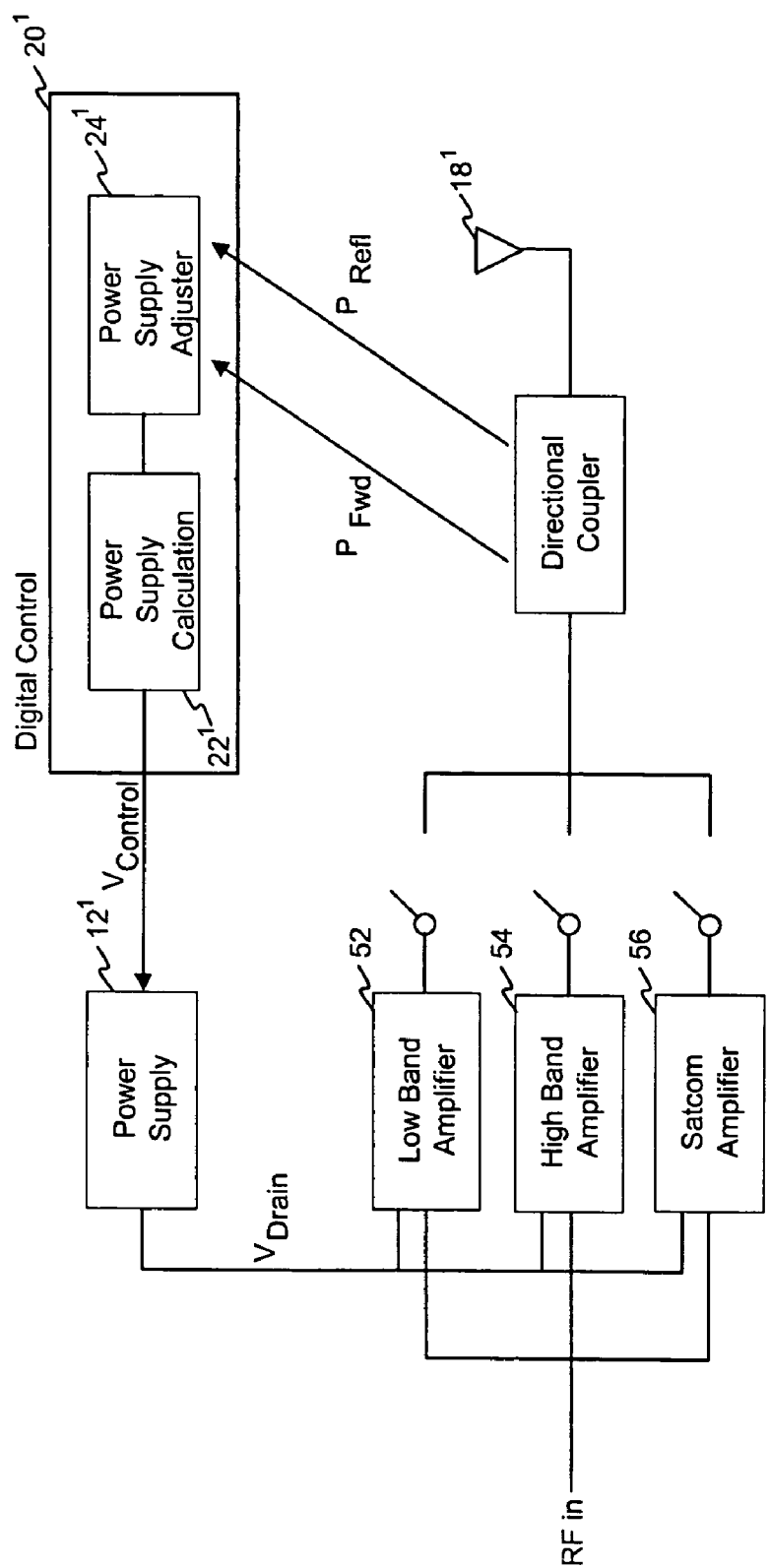
FIG. 5 is a block diagram of an exemplary transmit subsystem having three different amplifiers.

A more robust radio configuration may employ more than one type of power amplifier for driving the antenna. FIG. 5 illustrates an exemplary configuration for the transmit subsystem 50 having three different amplifiers: a low band amplifier 52, a high band amplifier 54 and an amplifier configured for satellite communications 56 (commonly referred to as a SATCOM amplifier). One of the amplifiers is selectively coupled to the antenna during signal transmission. Selection of the amplifier is dependent upon the waveform being transmitted as is known in the art. For example, a SINCGARS waveform will typically use the low band power amplifier. In contrast, high-data rate waveform will typically use a high band power amplifier.

In this configuration, the power supply calculator 22 begins by selecting the appropriate amplifier based on the waveform being transmitted. An initial power setting for the selected amplifier is then computed by the power supply calculator 22. In an exemplary embodiment, the drain voltage and/or bias current are read from an empirically derived table as described above. However, a different table is derived for each of the different amplifiers. The tables are preferably stored with each amplifier, but may be centrally stored on the digital signal processor. Otherwise, the initial power setting is selected and implemented as described above.

Furthermore, the power supply adjustor 24 may employ a different adjustment function for each amplifier. In other words, a first adjustment function is used for the low band amplifier; whereas, a second adjustment function is used for the high band amplifier. The power supply adjustor 24 selects the applicable adjustment function based on the amplifier being used to transmit the signal. The power supply adjustor 24 then computes an adjustment for the power setting using the selected function. In this way, an adjustment functions may be specifically tailored to the characteristics of the amplifier.

The above description is merely exemplary in nature and is not intended to limit the present disclosure, application, or uses.

What is claimed is:

1. A method for managing power consumption in a software-defined radio, comprising:
    identifying a waveform to be transmitted by the radio;
    determining a drain voltage for a power amplifier based on a characteristic of the waveform, where the power amplifier is coupled to an antenna of the radio;
    transmitting the waveform from the antenna using the drain voltage as an input to the power amplifier;
    calculating a voltage standing wave ratio (VSWR) for the transmitted waveform; and
    adjusting the power output by the power amplifier to the antenna by adjusting the drain voltage by a multiplier that is a square root value of the calculated VSWR divided by a highest anticipated value of VSWR.

2. The method of claim 1 wherein determining a drain voltage further comprises selecting a drain voltage based on an operation mode of the power amplifier.

3. The method of claim 1 wherein determining a drain voltage further comprises selecting a drain voltage based on a transmission frequency of the waveform.

4. The method of claim 1 further comprises determining a bias current for the power amplifier based on a characteristic of the waveform and transmitting the waveform from the antenna using the bias current as an input to the power amplifier.

5. The method of claim 1 wherein adjusting the power output further comprises adjusting a bias current of the power amplifier as a function of the VSWR.

6. The method of claim 1 wherein adjusting the power output further comprises adjusting a voltage output by a variable power supply component that is driving the antenna.

7. The method of claim 1 wherein adjusting the power output further comprises using a first adjustment function for a first type of waveform and using a second different adjustment function for a second type of waveform.

8. The method of claim 1 wherein adjusting the power output further comprises adjusting a drain voltage of the power amplifier and a bias current of the power amplifier as a function of the VSWR.

9. A power management system for a software-defined radio, comprising:
    an antenna;
    a regulated power supply;
    a power amplifier adapted to receive an RE transmit signal and operable to amplify the RE transmit signal in accordance with a drain voltage input from the power supply;
    a power supply calculator adapted to receive an indicator of a type of waveform to be transmitted by the radio and operable to determine the drain voltage for the power amplifier based on the waveform indicator; and
    a power supply adjustor adapted to receive a forward power output to the antenna and a reflected power from the antenna, the power supply adjustor operable to compute a voltage standing wave ratio (VSWR) based on the forward power and the reflected power and adjust the drain voltage of the power amplifier by a multiplier that is a square root value of the calculated VSWR divided by a highest anticipated value of VSWR.

10. The power management system of claim 9 wherein the power supply calculator selects an operating mode for the power amplifier based on the waveform indicator and determines the drain voltage for the power amplifier based in part on the selected operating mode for the power amplifier.

11. The power management system of claim 9 wherein the power supply calculator determines the drain voltage for the power amplifier based in part on a transmission frequency for the RF transmit signal.

12. The power management system of claim 9 wherein the power supply calculator outputs a control voltage to the power supply that regulates the drain voltage output by the power supply to the power amplifier.

13. The power management system of claim 9 wherein the power supply calculator is operable to determine a bias current for the power amplifier based on the waveform indicator.

14. The power management system of claim 9 wherein the power supply adjustor adjusts a bias current for the power amplifier based on the VSWR.

15. The power management system of claim 9 further comprises a directional coupler interposed between the power amplifier and the antenna, and operable to detect the forward power output to the antenna and the reflected power from the antenna.

16. The power management system of claim 15 wherein the power supply calculator and power supply adjustor reside in a digital signal processor, and the digital signal processor is adapted to receive the forward power and reflected power from the directional coupler and operable to compute the voltage standing wave ratio (VSWR).

17. The power management system of claim 15 wherein the power supply adjustor adjusting the drain voltage using a first adjustment function for a first type of waveform and a second different adjustment function for a second type of waveform.

* * * * *

UNITED STATES PATENT AND TRADEMARK OFFICE
CERTIFICATE OF CORRECTION

PATENT NO. : 7,590,395 B2  Page 1 of 1
APPLICATION NO. : 11/494287
DATED : September 15, 2009
INVENTOR(S) : Richard James Buckley It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 497 days.

Signed and Sealed this

Twenty-first Day of September, 2010

David J. Kappos
*Director of the United States Patent and Trademark Office*